(12) United States Patent
Cagle et al.

(10) Patent No.: US 11,495,478 B2
(45) Date of Patent: Nov. 8, 2022

(54) UNINHIBITED COOLING PATH SOLUTION FOR ACTIVE THERMAL CONTROL IN DEVICE TESTING

(71) Applicant: Advanced Micro Devices, Inc., Santa Clara, CA (US)

(72) Inventors: Travis Oneal Cagle, Austin, TX (US); Sheldon S. Grooms, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 115 days.

(21) Appl. No.: 16/715,459

(22) Filed: Dec. 16, 2019

(65) Prior Publication Data

US 2021/0183668 A1 Jun. 17, 2021

(51) Int. Cl.
*H05K 7/20* (2006.01)
*H01L 21/67* (2006.01)
*G01R 31/28* (2006.01)
*F27B 17/00* (2006.01)

(52) U.S. Cl.
CPC .... *H01L 21/67109* (2013.01); *G01R 31/2891* (2013.01); *H01L 21/67248* (2013.01); *F27B 17/0025* (2013.01)

(58) Field of Classification Search
CPC ......... H01L 21/67098; H01L 21/67248; F27B 17/0025; G06F 1/20; G06F 1/206; H05K 7/20
See application file for complete search history.

(56) References Cited

U.S. PATENT DOCUMENTS

| | | | | |
|---|---|---|---|---|
| 6,173,760 B1* | 1/2001 | Gardell | ............... | H01L 23/4332 165/104.33 |
| 6,448,575 B1* | 9/2002 | Slocum | .................. | H01L 23/34 257/48 |
| 6,486,540 B2* | 11/2002 | Senba | ..................... | H01L 23/34 257/E25.011 |
| 8,096,136 B2* | 1/2012 | Zheng | ................... | H01L 23/467 62/3.2 |
| 8,766,656 B2 | 7/2014 | Malik et al. | | |
| 9,116,200 B2* | 8/2015 | Fregeau | ................. | G01R 31/26 |
| 9,448,278 B2 | 9/2016 | Schroeder et al. | | |
| 10,119,776 B2 | 11/2018 | Di Stefano | | |
| 10,281,521 B2* | 5/2019 | Song | ..................... | H05B 6/105 |

(Continued)

*Primary Examiner* — Gregory A Wilson
(74) *Attorney, Agent, or Firm* — Kowert Hood Munyon Rankin and Goetzel PC; Rory D. Rankin (57) ABSTRACT

Systems, apparatuses, and methods for efficiently performing active thermal control during device testing are disclosed. A device testing system includes a device under test, a thermal structure on top of the device under test, and a controller configured to determine when to apply and remove thermal energy to the device under test through the thermal structure. The thermal structure includes a thermal transfer block that transfers thermal energy to and from the device under test below the thermal transfer block. The thermal structure also includes a coolant block above the thermal transfer block that removes thermal energy from the thermal transfer block. There is no heating element between the coolant block and the thermal transfer block. Rather, the thermal structure includes a heating element in a wall of the thermal transfer block. Therefore, an unobstructed thermal path exists from the device under test to the coolant block.

20 Claims, 6 Drawing Sheets

(56) References Cited

U.S. PATENT DOCUMENTS

| | | | |
|---|---|---|---|
| 2004/0035492 A1* | 2/2004 | Marchadour | G01F 11/024 141/67 |
| 2004/0036492 A1* | 2/2004 | Gaasch | G01R 1/0458 324/750.09 |
| 2011/0132000 A1* | 6/2011 | Deane | F25B 21/04 62/3.3 |
| 2015/0309112 A1* | 10/2015 | Goh | G01R 31/2874 324/750.08 |

* cited by examiner

UNINHIBITED COOLING PATH SOLUTION FOR ACTIVE THERMAL CONTROL IN DEVICE TESTING

BACKGROUND

Description of the Related Art

Semiconductor fabrication of integrated circuits is a complicated process. Generally speaking, the fabrication steps include inserting doped silicon layers in a silicon substrate, using masks to etch particular regions of the silicon wafer, building three-dimensional (3D) structures, filling vias with conducting metal, and so forth. Multiple of the steps are high temperature steps and the geometric dimensions are continually scaling downward, which provides smaller tolerances on mask dimensions. Any variations on the wafer from expected design requirements cause deviation from the expected performance.

Functional dies are placed in bins based on their measured parameters. Functional dies are removed from the silicon wafer and grouped with other dies with similar measured parameters. These similar measured parameters differ from other dies by a particular threshold. One measured parameter is the operational clock frequency. The resulting integrated circuits are sold in different products with different prices. During testing, test equipment is used to characterize the dies. This test equipment both heats and cools the die, which is the device under test (DUT). To properly characterize the DUT, the test equipment needs to maintain a particular temperature for a window of time. Any delays in heating and cooling causes the DUT to operate under a different temperature than an expected temperature. Therefore, the DUT could be incorrectly characterized.

In view of the above, efficient methods and mechanisms for efficiently performing active thermal control during device testing are desired.

BRIEF DESCRIPTION OF THE DRAWINGS

The advantages of the methods and mechanisms described herein may be better understood by referring to the following description in conjunction with the accompanying drawings, in which.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for efficiently performing active thermal control during device testing are disclosed. In various embodiments, a device testing system includes a device under test, a thermal structure on top of the device under test, and a controller configured to determine when to apply and remove thermal energy to the device under test through the thermal structure. In some embodiments, the thermal structure includes a thermal transfer block that transfers thermal energy to and from the device under test below the thermal transfer block. The thermal structure also includes a coolant block above the thermal transfer block that removes thermal energy from the thermal transfer block. The thermal structure additionally includes a heating element in a wall of the thermal transfer block, which adds thermal energy to the thermal transfer block from an external heater. The thermal transfer block transfers thermal energy from the device under test to the coolant block without initially removing thermal energy from the heating element. Since the thermal structure has no heating element between the coolant block and the thermal transfer block, there is an unobstructed thermal path from the device under test to the coolant block.

Figure 1:
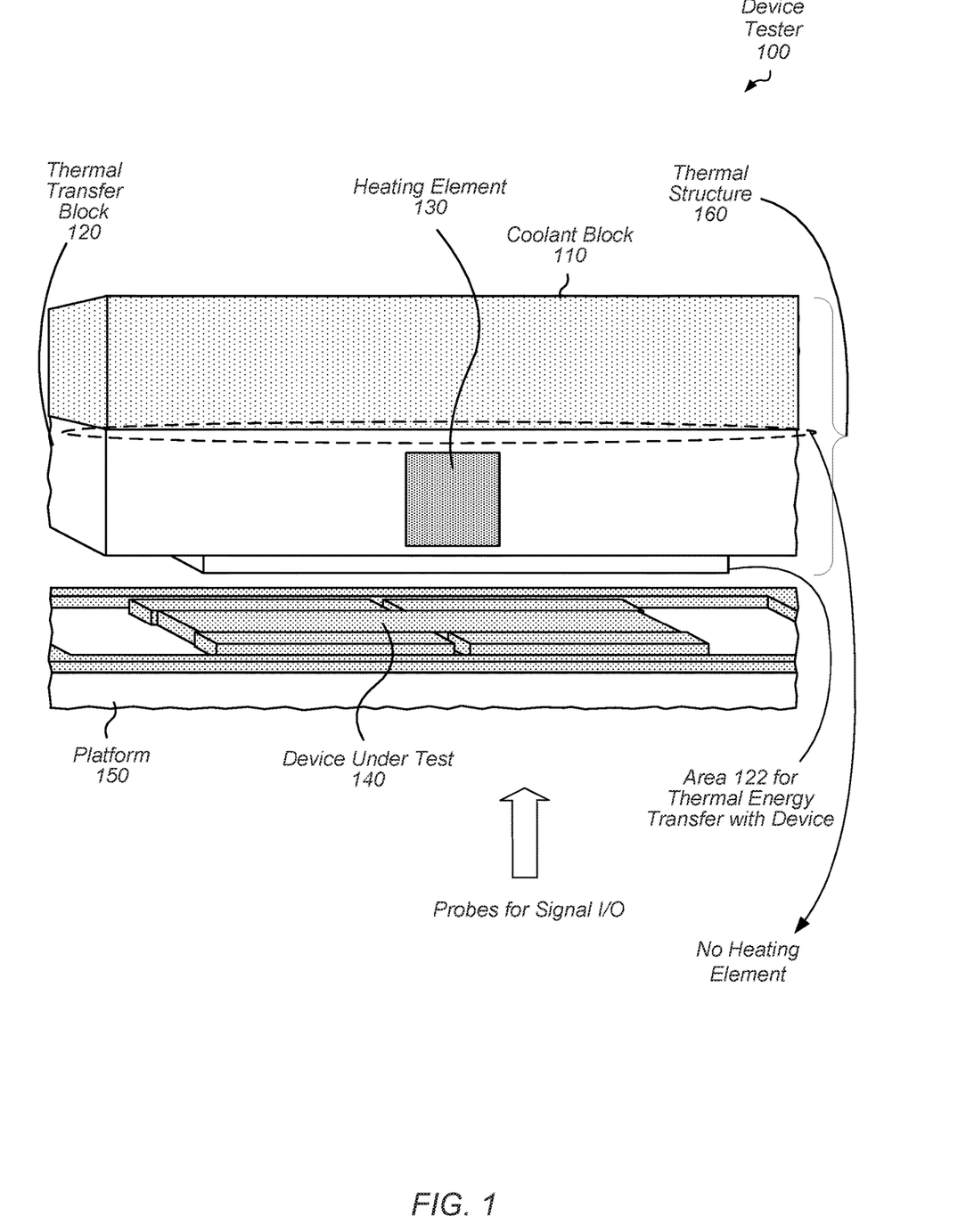
FIG. 1 is a block diagram of one embodiment of a device tester.

Referring to FIG. 1, one embodiment of a device tester 100 is shown. The device tester 100 includes the thermal structure 160, which is later put in physical contact with the device under test 140. The thermal structure 160 includes multiple components such as the coolant block 110 and the thermal transfer block 120. The thermal transfer block includes a heating element 130 and an area 122 for thermal energy transfer with the device under test 140. The device under test 140 is placed on a flat platform 150, which is also referred to as a "chuck 150." In various embodiments, the device under test 140 is a die that already passed initial functional testing while the die was still on a wafer and later the die was removed from the wafer by a process referred to as wafer dicing.

In some embodiments, the device under test 140 is flipped to allow for pads to be probed through an open area of the platform 150 while the area 122 of the thermal structure 160 makes contact with the backside of the device under test 140. In an embodiment, testing equipment (not shown) has wires or needles underneath the platform to probe the die. The testing equipment also includes hardware to execute software written by designers to perform a testing algorithm. Similar to the first phase of testing, automated test equipment provides inputs to the device under test 140 through the needles or other contacts, and the automated test equipment measures output values on particular pads of the device under test 140.

In one embodiment, the automated test equipment sends inputs for basic functionality, such as an addition operation, to the device under test 140. The automated test equipment continues to increase the operational clock frequency of the device under test 140 for a particular supply voltage until the device under test 140 provides an incorrect result. The automated test equipment stores the results of a test and repeats this type of testing for different power supply voltages. Afterward, the automated test equipment categorizes the device under test 140 in a bin based on temperature and operational parameters of passed tests. The device under test 140 is grouped in a bin with other devices with similar measured operational parameters. Examples of the operational parameters are maximum operating frequency of a clock signal, power consumption, setup and hold times for sequential elements, duty cycle of a clock signal, transistor threshold voltages, leakage current, and so forth. At a later time, the device under test 140 is placed in a package for further functionality tests and characterization tests prior to placing the package part in a product for sale.

During this second phase of testing using the thermal structure 160, the operational temperature of the device under test 140 should remain at a particular value with relatively low tolerance for deviations. In some embodiments, the operational temperature is measured by an on-die temperature sensor of the device under test 140. When the thermal structure 160 is in physical contact with the device under test 140, the thermal structure 160 adjusts an amount of thermal energy transferred to the device under test 140. An external heater or other equipment (not shown) sends current to flow into the heating element 130 in the wall of the thermal transfer block to provide heat, or thermal energy, to the device under test 140. The external heater is controlled by automated test equipment executing the test algorithm defined in a software program. In various embodiments, each of the coolant block 110 and the thermal transfer block 120 is made of copper, which provides thermal energy transport above a threshold. In other embodiments, another material is used for the coolant block 110 and the thermal transfer block 120.

In some embodiments, the coolant block includes passages (not shown) for transporting coolant through the coolant block 110. In an embodiment, the coolant is water. In various embodiments, the coolant block 110 is always turned on, rather than turned on and off as is the heating element 130. The coolant block 110 continually attempts to remove thermal energy (heat) from the device under test 140 through the thermal transfer block 120. However, in various embodiments, there is no heating element below the coolant block 110. In other words, there is no heating element between the coolant block 110 and the thermal transfer block 120. Rather, the thermal structure 160 includes the heating element 130 in the wall of the thermal transfer block 120. Therefore, an unobstructed thermal path exists from the device under test 140 to the coolant block 110, which allows for the thermal structure 120 to transfer thermal energy from the device under test 140 to the coolant block 110 without initially removing thermal energy from a heating element.

The coolant block 110 removes thermal energy from the device under test 140 through the unobstructed path in the thermal transfer block 120 when the external heater no longer supplies current to the heating element 130. In some embodiments, the heating element 130 is made of a ceramic material. Although a single heating element 130 is shown, in other embodiments, the thermal transfer block 120 includes multiple heating elements, each in a wall of the thermal transfer block 120. No heating element is placed underneath the coolant block 110.

Figure 2:
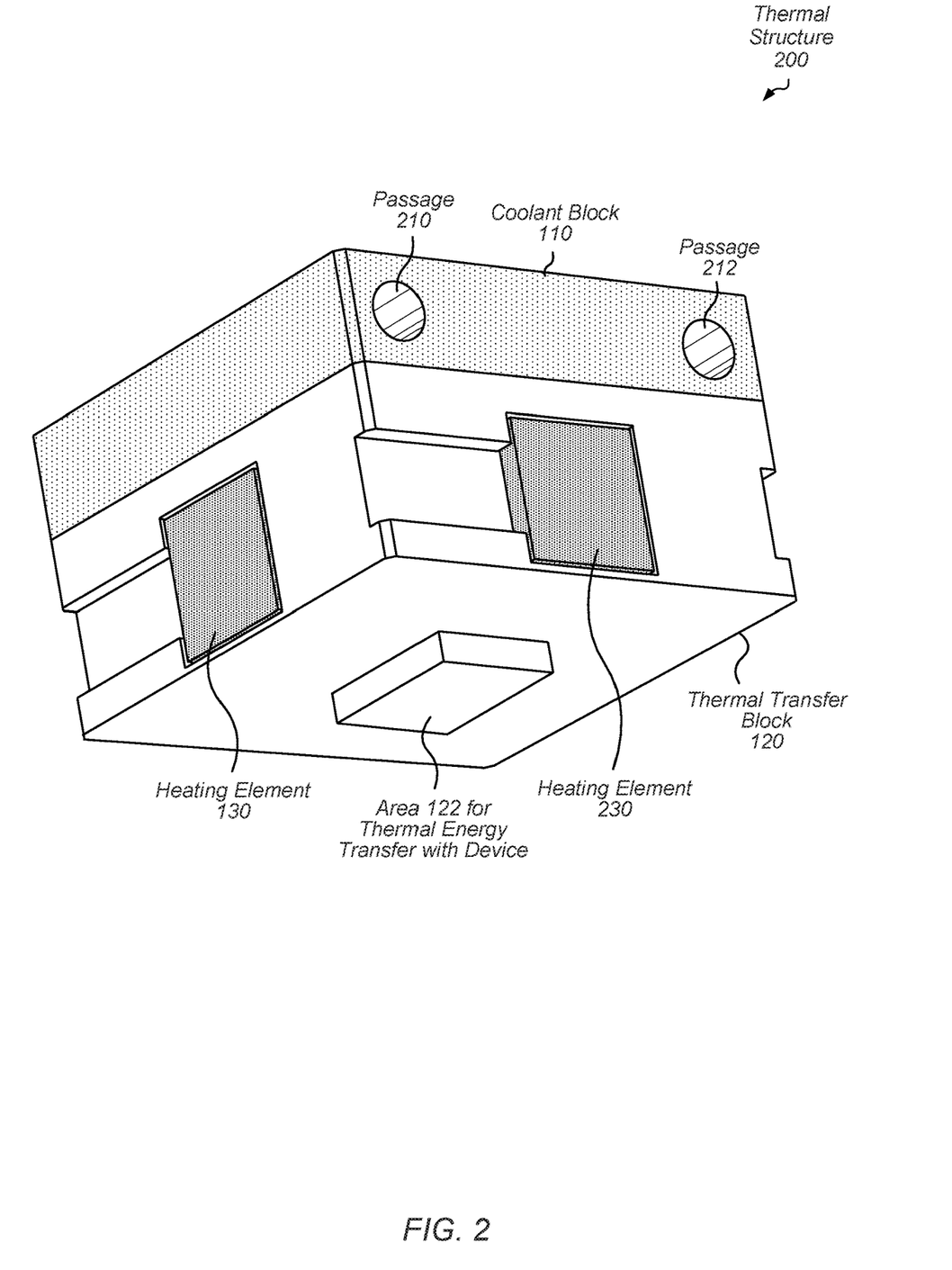
FIG. 2 is a block diagram of one embodiment of a thermal structure used when testing a device.

Turning now to FIG. 2, one embodiment of a thermal structure 200 used when testing a device under test is shown. Components and materials previously described are numbered identically. The thermal structure 200 includes the coolant block 110 and the thermal transfer block 120. The coolant block 110 includes passages 210 and 212 for transporting coolant such as water. The thermal transfer block 120 includes the heating element 130 in a wall and additionally includes the heating element 230 in another wall. The thermal structure 200 includes no heating element between the coolant block 110 and the thermal transfer block 120. Although the two heating elements 130 and 230 are shown, in other embodiments, the thermal transfer block 120 includes other heating elements, each in a wall of the thermal transfer block 120.

In some embodiments, the thermal structure 200 adjusts a temperature of a device under test (not shown) in physical contact with the area 122 by having the coolant flow through the passages 210 and 212 as well as the current flow to the heating elements 130 and 230 adjusted by external testing equipment. Therefore, in an embodiment, the coolant block 110 does not always attempt to remove thermal energy from the device under test through the unobstructed path in the thermal transfer block 120. Rather, the external testing equipment determines when to provide coolant flow through the passages 210 and 212, when to cut off or turn off coolant flow through the passages 210 and 212, when to apply current to the heating elements 130 and 230, what amount of current to use, and when to turn off current flow to the heating elements 130 and 230. By altering both the coolant flow and the current flow, the external testing equipment attempts to maintain a constant operating temperature for the device under test through the thermal structure 200. In an embodiment, the external testing equipment uses an on-die temperature sensor of the device under test to determine when and by how much to alter the coolant flow and the current flow.

Figure 3:
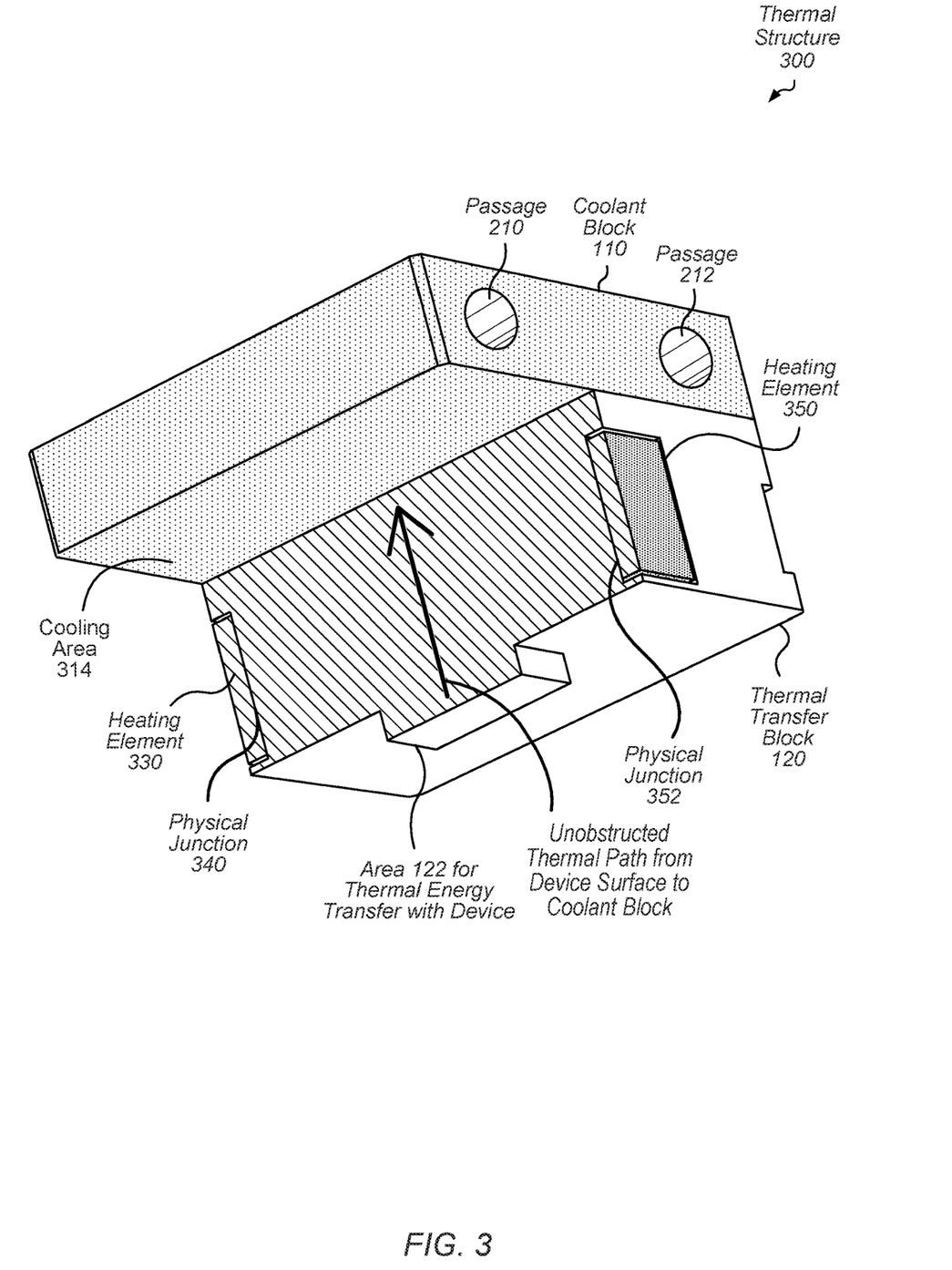
FIG. 3 is a block diagram of one embodiment of a cross-section of a thermal structure used when testing a device.

Referring to FIG. 3, one embodiment of a cross-section of a thermal structure 300 used when testing a device is shown. Components and materials previously described are numbered identically. The thermal structure 300 includes the coolant block 110 and the thermal transfer block 120. The coolant block 110 includes passages 210 and 212 for transporting coolant such as water. The thermal transfer block 120 includes the heating element 330 in a wall and additionally includes the heating element 350 in another wall. The thermal structure 300 includes no heating element between the coolant block 110 and the thermal transfer block 120. For example, the cooling area 314 has direct physical contact with the thermal transfer block 120. The cross-section view of the thermal structure 300 shows the unobstructed path from the area 122, which makes physical contact with a device under test (not shown), and the coolant block 110.

As shown, the heating elements 330 and 350 do not significantly extend into the thermal transfer block 120, which allows for the unobstructed path to reach nearly across the entire width of the thermal transfer block 120. In other thermal structures, a heating element is placed at the top of the thermal transfer block 120 and extends across the width of the thermal transfer block. In these other thermal structures, an obstructed path exists between the area 122 and the coolant block 110. However, in contrast to these other thermal structures, the thermal structure 300 has no heating element between the coolant block 110 and the thermal transfer block 120. Additionally, the thermal structure 300 has an unobstructed path between the area 122 and the coolant block 110 that reaches across almost the full width of the thermal transfer block 120.

Although the two heating elements 330 and 350 are shown in the thermal structure 300, in other embodiments, the thermal transfer block 120 includes other heating elements, each in a wall of the thermal transfer block 120. Each of the heating elements 330 and 350 has a respective physical junction 340 and 352 making contact with the thermal transfer block 120. In some embodiments, one or more of the physical junctions 340 and 352 include thermal grease. In other embodiments, one or more of the physical junctions 340 and 352 include graphite. In yet other embodiments, one or more of the physical junctions 340 and 352 include another material between the thermal transfer block 120 and the heating elements 330 and 350.

Regardless of the material used in the physical junctions 340 and 352, in some embodiments, air pockets are inadvertently created in the material. Therefore, both the material and the air pockets in the physical junctions 340 and 352 retain heat or thermal energy. However, due to the placement of the heating elements 330 and 350 in the walls of the thermal transfer block 120, when external test equipment determines to cool off the device under test, the thermal energy transported through the unobstructed path is not required to remove thermal energy from the heating elements 330 and 350 or the physical junctions 340 and 352 prior to cooling off the device under test. In contrast, for other thermal structures with a heating element under the coolant block 110 extending across the width of the thermal transfer block 120, when external test equipment determines to cool off the device under test, thermal energy is transported through the obstructed path and it is required to remove thermal energy from the heating element and the corresponding physical junction. With the placement of the heating elements 330 and 350 in the walls of the thermal transfer block 120, the thermal structure 300 is more efficient at transporting thermal energy to and from the device under test making physical contact with the area 122.

Figure 4:
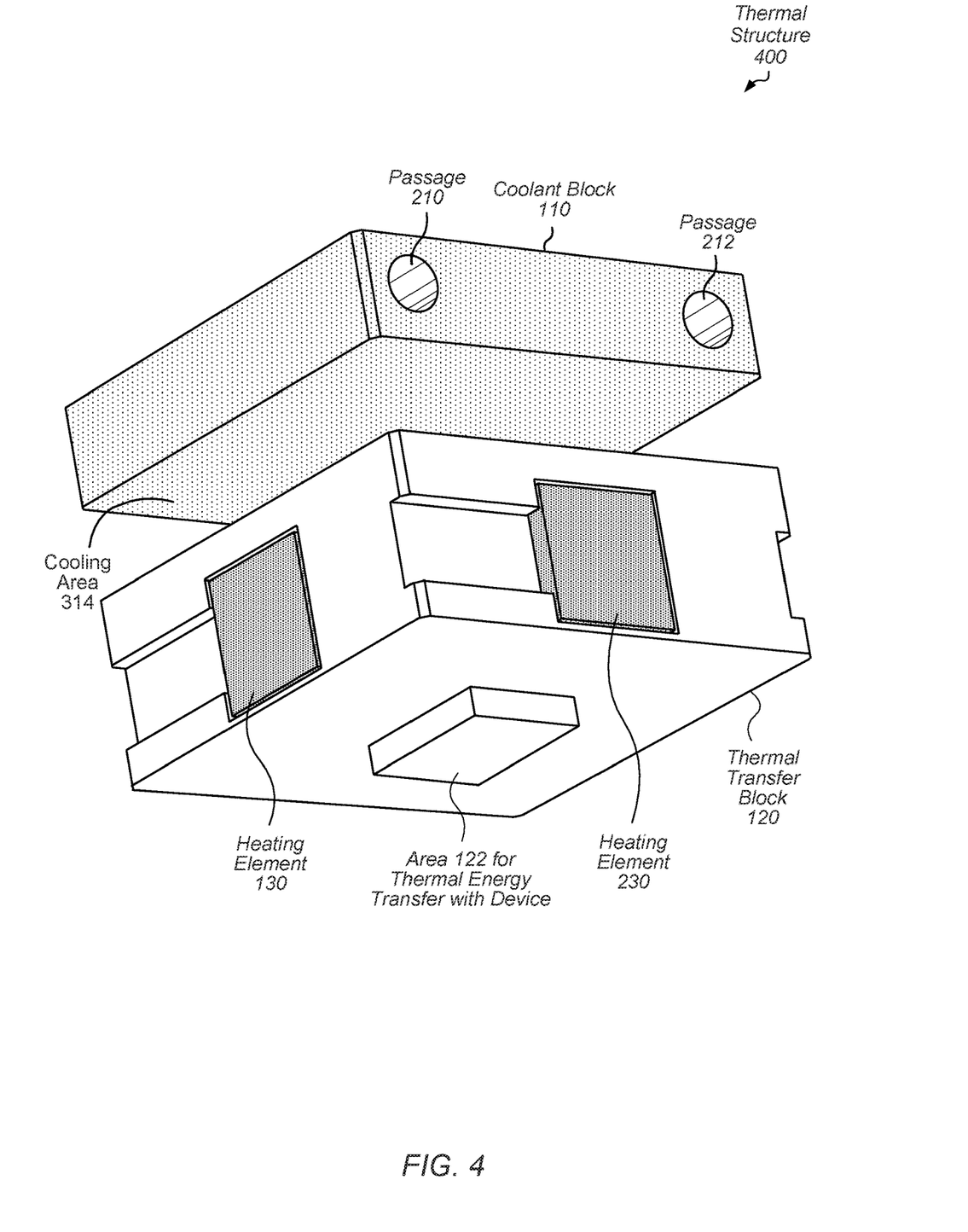
FIG. 4 is a block diagram of one embodiment of an expanded view of a thermal structure used when testing a device.

Turning now to FIG. 4, one embodiment of an expanded view of a thermal structure 400 used when testing a device is shown. Components and materials previously described are numbered identically. The thermal structure 400 includes the coolant block 110 and the thermal transfer block 120. The coolant block 110 includes passages 210 and 212 for transporting coolant such as water. The thermal transfer block 120 includes the heating element 130 in a wall and additionally includes the heating element 230 in another wall. The expanded view of the thermal structure 400 shows no heating element between the coolant block 110 and the thermal transfer block 120. For example, the cooling area 314 has direct physical contact with the thermal transfer block 120. With no heating element between the coolant block 110 and the thermal transfer block 120, the thermal structure 400 has an unobstructed path between the area 122, which makes physical contact with a device under test (not shown), and the coolant block 110.

Figure 5:
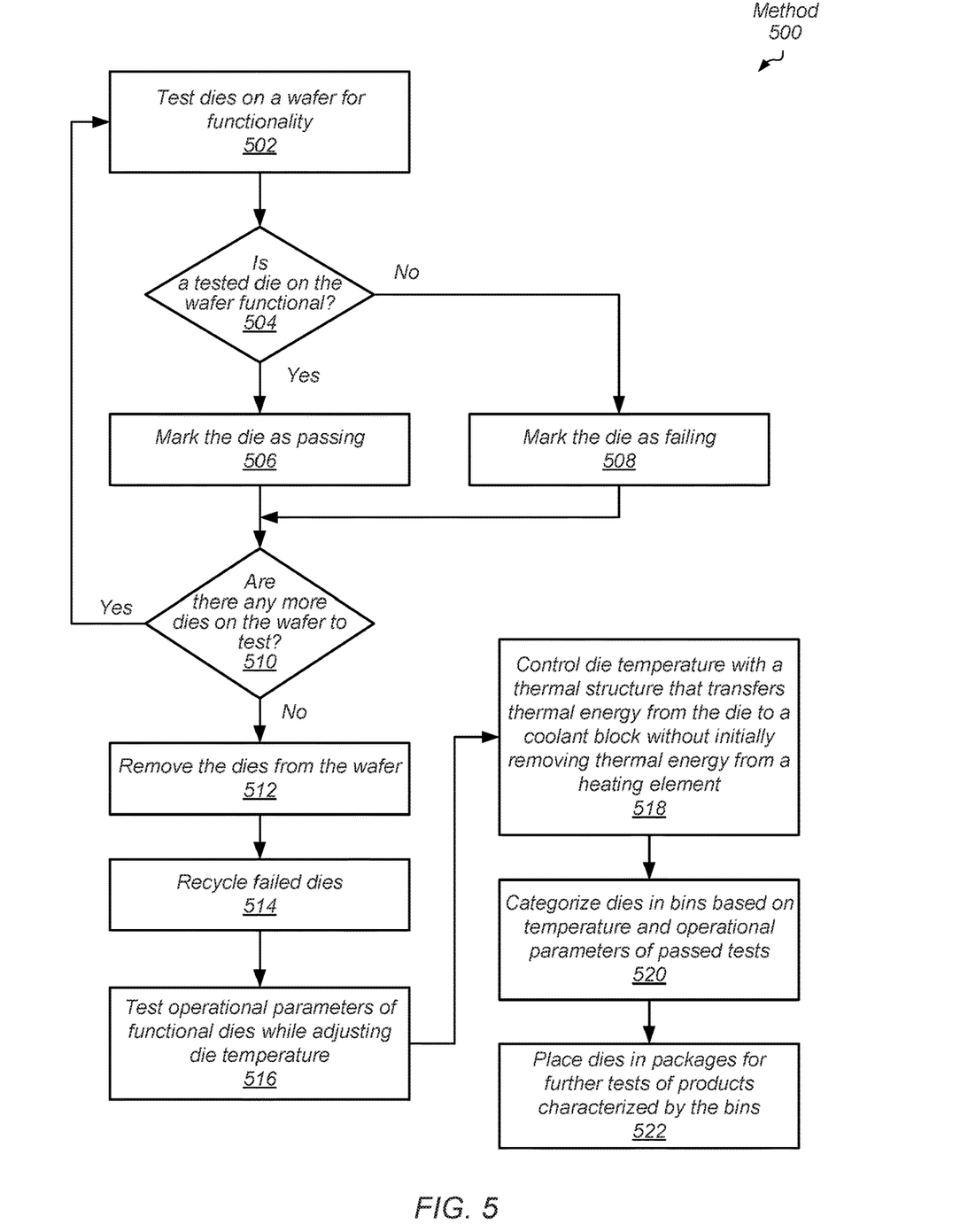
FIG. 5 is a flow diagram of one embodiment of a method for efficient active thermal control during device testing.

Referring to FIG. 5, one embodiment of a method 500 for efficient active thermal control during device testing is shown. For purposes of discussion, the steps in this embodiment (as well as in FIG. 6) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement methods 500 and 600.

A semiconductor fabrication site fabricates semiconductor wafers using multiple, complicated fabrication steps. When the fabrication equipment completes a semiconductor wafer, fabrication technicians and engineers use automated test equipment to test the multiple dies on the wafer to determine which dies to assemble in packages to place in products. Typically, the testing stage includes multiple phases. A first phase of testing tests the multiple dies on the wafer for functionality (block 502). The first phase determines whether dies on the wafer are capable of continuing to later phases. The first phase of testing is also referred to as a wafer probe. The first phase determines whether a die is capable of powering up and performing some basic tasks. In addition, the first phase determines values for one or more operational parameters of the die. The technicians and engineers use the first phase to also determine a yield for the fabrication process, which is used to adjust the steps of the fabrication process.

During the first phase of testing, the wafers are removed from their carriers and placed on a flat platform, which is also referred to as a chuck. A probe card includes multiple, tiny needles with particular spacing between them to align with bond pads of a die on the wafer. Under the direction of software algorithms, the automatic test equipment provides values on the pads to generate test inputs at particular points in time and measures outputs. Therefore, the automatic test equipment determines the electrical parameters of the die and whether the die is capable of performing basic functionality.

If the testing steps determine a tested die on the wafer is functional ("yes" branch of the conditional block 504), then the die is marked as passing (block 506). Otherwise, if the testing steps determine a tested die on the wafer is not functional ("no" branch of the conditional block 504), then the die is marked as failing (block 508). If there are more dies on the wafer to test ("yes" branch of the conditional block 510), then control flow of method 500 returns to block 502 where the first phase of testing continues to test the multiple dies on the wafer for functionality.

If there are no more dies on the wafer to test ("no" branch of the conditional block 510), which means all of the dies have been tested, then the technicians and engineers remove the dies from the wafer (block 512). Technicians remove the multiple dies from the wafer by a process referred to as "wafer dicing." Typically, the technicians use laser cutting when performing wafer dicing. The failed dies are recycled (block 514). In some cases, these dies are tested further to determine the faults on the dies. For example, technicians perform stuck-at fault testing and other short-circuit testing, search for poorly constructed vias, search for open circuits in transmission lines and other metal routes, and so forth. In some cases, these die are later recycled in a process referred to as a semiconductor reclaim process.

For dies that passed the first phase of testing, technicians using other test equipment test operational parameters of the functional dies while adjusting die temperature (block 516). The second phase of testing occurs before these dies are placed in semiconductor packages. Typically, this second phase of testing determines a maximum value for operational parameters such as at least an operational clock frequency at different power supply voltages. A die is placed on a flat platform or chuck. In some embodiments, the die is flipped to allow for pads to be probed while a thermal structure makes contact with the backside of the die. In an embodiment, the testing equipment has wires or needles underneath the platform to probe the die. Similar to the first phase of testing, automated test equipment provides inputs to the die through the needles or other contacts, and the automated test equipment measures output values on particular pads.

In one embodiment, the automated test equipment sends inputs for basic functionality such as an addition operation, and continues to increase the operational clock frequency for a particular supply voltage until the die provides an incorrect result. The automated test equipment repeats this type of testing for different power supply voltages. During this second phase of testing, the operational temperature of the die should remain at a particular value with relatively low tolerance for deviations. The thermal structure in contact with the die adjusts an amount of thermal energy transferred to the die. An external heater or other equipment sends current to flow into a heating element on the thermal structure to provide heat, or thermal energy, to the die. The external heater is controlled by test equipment executing a test algorithm defined in a software program.

The test equipment controls the die temperature with the thermal structure that transfers thermal energy from the die to a coolant block without initially removing thermal energy from a heating element (block 518). For example, the thermal structure includes a thermal transfer block for transferring thermal energy to and from the die. In an embodiment, the thermal transfer block is made of copper. The thermal structure also includes a coolant block on top of the thermal transfer block. The coolant block removes thermal energy from the die through the thermal transfer block when the external heater no longer supplies current to the thermal structure. The coolant block includes passages for coolant to flow. In one embodiment, the coolant is water. In some embodiments, the coolant block is made of copper similar to the thermal transfer block.

There is no heating element between the coolant block and the thermal transfer block. Rather, the thermal structure includes a heating element in a wall of the thermal transfer block. Therefore, an unobstructed thermal path exists from the device under test to the coolant block, which allows for the thermal structure to transfer thermal energy from the die to the coolant block without initially removing thermal energy from a heating element. In some embodiments, the heating element is made of a ceramic material.

The automated test equipment categorizes the die in a bin based on temperature and operational parameters of passed tests (block 520). Functional dies are placed in bins based on their measured parameters. These functional dies, which are already removed from the silicon wafer, are grouped in a bin with other dies with similar measured parameters. These similar measured parameters differ from other dies by a particular threshold. One measured parameter is the operational clock frequency. During the fabrication of the semiconductor wafers, the fabrication equipment processed one or more batches of wafers in a similar time span. As described earlier, the dies on these wafers include operational parameters that differ from other dies in the same batches due to process variations.

In some cases, other batches of wafers with the same functionality are processed at a different time and possibly by different fabrication equipment, which also causes variations in operational parameters. Examples of the operational parameters are leakage current, maximum operating frequency of a clock signal, power consumption, setup and hold times for sequential elements, duty cycle of a clock signal, transistor threshold voltages, and so forth. The dies are removed from the test equipment for the second phase of testing and placed in packages for further tests of products characterized by the bins (block 522). More functionality tests and characterization tests are performed in the third phase prior to placing the package part in a product for sale.

Figure 6:
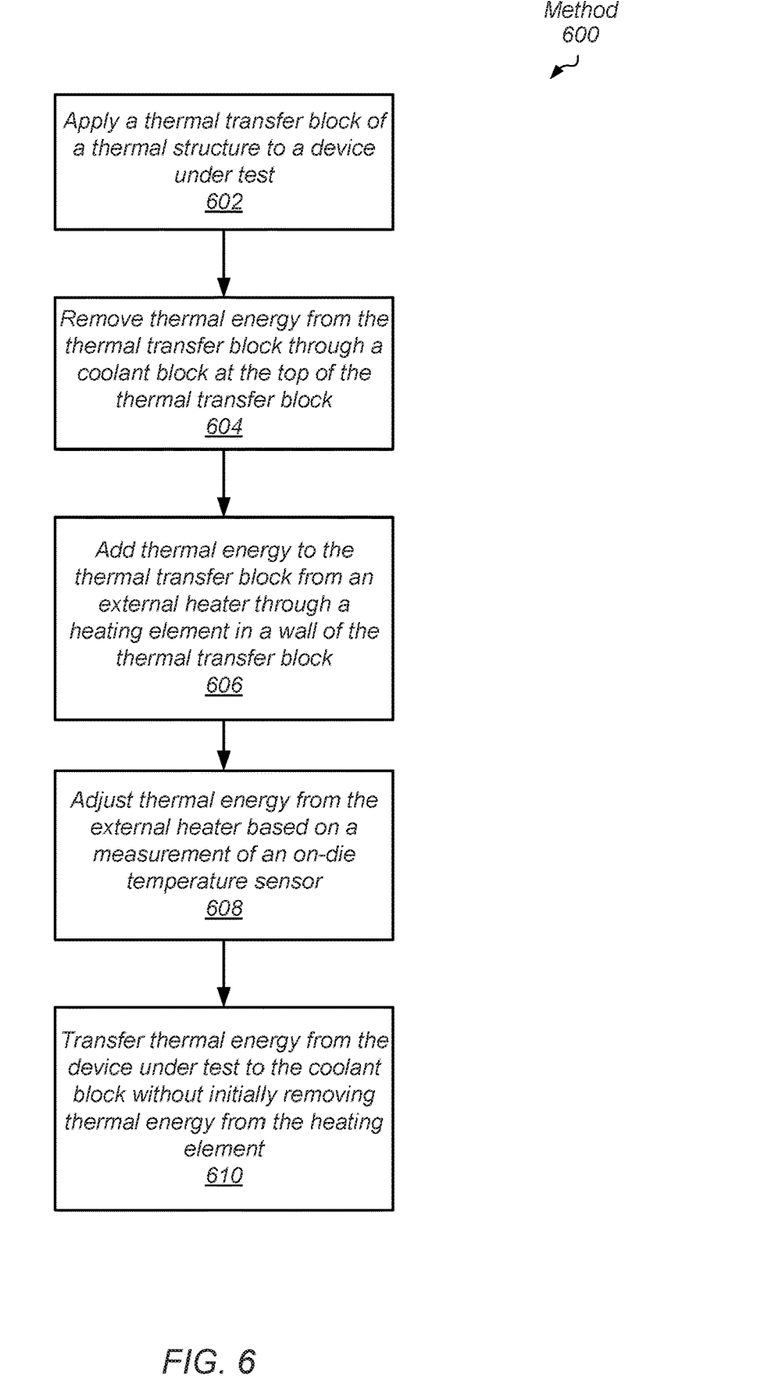
FIG. 6 is a flow diagram of one embodiment of a method for efficient active thermal control during device testing.

Turning now to FIG. 6, one embodiment of a method 600 for efficient active thermal control during device testing is shown. A second phase of testing a die begins by automated test equipment applying a thermal transfer block of a thermal structure to a die under test (block 602). The die under test may also be referred to as a device under test. As described earlier, the device under test already passed a first phase of testing such as a wafer probe. The die of the device is placed on a flat platform and electrical input signals are provided to input pads of the device from below by test equipment.

A coolant block at the top of the thermal transfer block removes thermal energy from a thermal transfer block of the thermal structure (block 604). The thermal structure includes the coolant block on top of a thermal transfer block, which makes physical contact with the device under test. In various embodiments, the thermal structure has the equivalent functionality of the thermal structures 160, 200, 300 and 400 (of FIGS. 1-4). The coolant block includes passages for coolant to flow. When an external heater no longer supplies current to the thermal structure, the thermal energy transfers from the device under test to the coolant block without obstruction of a heating element.

A heating element in a wall of the thermal transfer block adds thermal energy to the thermal transfer block from an external heater (block 606). In some embodiments, the thermal structure includes multiple heating elements, each in a wall of the thermal transfer block. In an embodiment, each wall of the thermal transfer block has a heating element. In another embodiment, one or more walls have no heating element while one or more other walls contain a heating element. The thermal structure includes no heating element underneath the coolant block.

In various embodiments, automated test equipment control when the external heater adds current to one or more heating elements to adjust the temperature of the device under test. In some embodiments, the automated test equipment monitors the temperature reported by one or more on-die temperature sensors of the device under test to determine when to turn on and off the external heater (block 608) for adjusting the operational temperature. With heating elements in the walls of the thermal transfer block, the thermal structure transfers thermal energy from the device under test to the coolant block without initially removing thermal energy from the heating element (block 610).

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors that execute program instructions.

It should be emphasized that the above-described embodiments are only non-limiting examples of implementations. Numerous variations and modifications will become appar-

What is claimed is:

1. An apparatus comprising:
   a thermal transfer block configured to transfer thermal energy to and from a device under test positioned below the thermal transfer block;
   a coolant block positioned above the thermal transfer block configured to remove thermal energy from the thermal transfer block; and
   a heating element in a wall of the thermal transfer block configured to add thermal energy to the thermal transfer block based on current flow from an external heater;
   wherein the thermal transfer block is configured to transfer thermal energy from the device under test to the coolant block without initially removing thermal energy from the heating element.

2. The apparatus as recited in claim 1, wherein thermal transfer block is further configured to transfer thermal energy from the device under test to the coolant block without initially removing thermal energy from a physical junction between the heating element and the thermal transfer block.

3. The apparatus as recited in claim 2, wherein the physical junction comprises graphite between the heating element and the thermal transfer block.

4. The apparatus as recited in claim 2, wherein the physical junction comprises thermal grease between the heating element and the thermal transfer block.

5. The apparatus as recited in claim 1, wherein the heating element is a ceramic heating element.

6. The apparatus as recited in claim 1, further comprising a plurality of heating elements, each in a separate wall of the thermal transfer block.

7. The apparatus as recited in claim 1, wherein control of the heating element adding thermal energy from the external heater is based on a temperature sensor on the device under test.

8. A method, comprising:
   transferring, by a thermal transfer block, thermal energy to and from a device under test positioned below the thermal transfer block;
   removing, by a coolant block, thermal energy from the thermal transfer block;
   adding, by a heating element in a wall of the thermal transfer block, thermal energy to the thermal transfer block based on current flow from an external heater; and
   transferring, by the thermal transfer block, thermal energy from the device under test to the coolant block without initially removing thermal energy from the heating element.

9. The method as recited in claim 8, further comprising transferring, by the thermal transfer block, thermal energy from the device under test to the coolant block without initially removing thermal energy from a physical junction between the heating element and the thermal transfer block.

10. The method as recited in claim 9, wherein the physical junction comprises graphite between the heating element and the thermal transfer block.

11. The method as recited in claim 9, wherein the physical junction comprises thermal grease between the heating element and the thermal transfer block.

12. The method as recited in claim 8, wherein the heating element is a ceramic heating element.

13. The method as recited in claim 8, further comprising adding thermal energy to the thermal transfer block by a plurality of heating elements, each in a separate wall of the thermal transfer block.

14. The method as recited in claim 8, wherein control of the heating element adding thermal energy from the external heater is based on a temperature sensor on the device under test.

15. A device testing system comprising:
   a device under test;
   a thermal structure on top of the device under test;
   a controller configured to determine when to apply and remove thermal energy to the device under test through the thermal structure;
   wherein the thermal structure comprises:
      a thermal transfer block configured to transfer thermal energy to and from the device under test;
      a coolant block above the thermal transfer block configured to remove thermal energy from the thermal transfer block;
      a heating element in a wall of the thermal transfer block configured to add thermal energy to the thermal transfer block based on current flow from an external heater; and
      wherein the thermal transfer block is configured to transfer thermal energy from the device under test to the coolant block without initially removing thermal energy from the heating element.

16. The device testing system as recited in claim 15, wherein the thermal transfer block is further configured to transfer thermal energy from the device under test to the coolant block without initially removing thermal energy from a physical junction between the heating element and the thermal transfer block.

17. The device testing system as recited in claim 15, wherein the physical junction comprises thermal grease between the heating element and the thermal transfer block.

18. The device testing system as recited in claim 17, wherein control of the heating element adding thermal energy from the external heater is based on a temperature sensor on the device under test.

19. The device testing system as recited in claim 15, wherein the heating element is a ceramic heating element.

20. The device testing system as recited in claim 15, wherein the thermal structure further comprises a plurality of heating elements, each in a separate wall of the thermal transfer block.

* * * * *